United States Patent
Qiao et al.

(10) Patent No.: US 11,565,908 B2
(45) Date of Patent: Jan. 31, 2023

(54) INTELLIGENT ELECTRIC WINDER AND CONTROL METHOD THEREFOR

(71) Applicant: INTRADIN (HUZHOU) PRECISION TECHNOLOGY CO., LTD., Huzhou (CN)

(72) Inventors: Xuetao Qiao, Huzhou (CN); Gaofeng Wang, Huzhou (CN)

(73) Assignee: INTRADIN (HUZHOU) PRECISION TECHNOLOGY CO., LTD., Huzhou (CN)

( * ) Notice: Subject to any disclaimer, the term of this patent is extended or adjusted under 35 U.S.C. 154(b) by 315 days.

(21) Appl. No.: 16/861,091

(22) Filed: Apr. 28, 2020

(65) Prior Publication Data
US 2021/0300719 A1    Sep. 30, 2021

(30) Foreign Application Priority Data
Mar. 24, 2020    (CN) .......................... 202010212160.8

(51) Int. Cl.
| | |
|---|---|
| H04B 3/46 | (2015.01) |
| B65H 75/44 | (2006.01) |
| H04W 4/80 | (2018.01) |
| H02G 11/02 | (2006.01) |
| H03K 17/687 | (2006.01) |

(52) U.S. Cl.
CPC ......... *B65H 75/4484* (2013.01); *H02G 11/02* (2013.01); *H03K 17/687* (2013.01); *H04W 4/80* (2018.02)

(58) Field of Classification Search
CPC ............ E04H 4/1645; H04B 1/40; H04B 3/23
USPC .................. 375/224, 295, 219; 254/271, 272
See application file for complete search history.

(56) References Cited

U.S. PATENT DOCUMENTS

| | | | |
|---|---|---|---|
| 2006/0027155 A1* | 2/2006 | Welch ..................... | B63B 34/67 114/254 |
| 2010/0224843 A1* | 9/2010 | Christensen ............ | B63B 34/67 254/270 |
| 2013/0032654 A1* | 2/2013 | Tracey ..................... | H02G 3/02 242/390.8 |
| 2014/0217225 A1* | 8/2014 | Widegren .......... | B65H 75/4449 242/370 |
| 2019/0271169 A1* | 9/2019 | Witelson ............... | E04H 4/1654 |

FOREIGN PATENT DOCUMENTS

| | | |
|---|---|---|
| CN | 106044370 A | 10/2016 |
| CN | 210162954 U | 3/2020 |

* cited by examiner

*Primary Examiner* — Khai Tran

(57) ABSTRACT

This application relates to electric winders, particularly, to an intelligent electric winder and a control method therefor. The intelligent electric winder includes a support, a control unit and a winder body, where the winder body includes a casing, a winding reel, a drive structure, and a cable. The drive structure is electrically connected to the control unit. The control unit includes: a socket and a host; the host is arranged inside the casing, and the socket is arranged outside the casing; a start/stop button is provided on a surface of the socket, and the socket is connected to a free end of the cable. Through the intelligent electric winder and a control method therefor, the winding reel is controlled to start or stop winding by sending a wireless control signal, so that the intelligent electric winder is controlled to wind or unwind cables through the wireless communication.

6 Claims, 6 Drawing Sheets

INTELLIGENT ELECTRIC WINDER AND CONTROL METHOD THEREFOR

CROSS-REFERENCE TO RELATED APPLICATIONS

This application claims the benefit of priority from Chinese Patent Application No. 202010212160.8, filed on Mar. 24, 2020. The content of the aforementioned application, including any intervening amendments thereto, is incorporated herein by reference in its entirety.

TECHNICAL FIELD

The present application relates to electric winders, and more particularly to an intelligent electric winder and a control method therefor.

BACKGROUND OF THE INVENTION

As a special long-distance energy transmission device, winders are mainly used to transmit hoses and wires, and become an indispensable device in automobile production and maintenance. However, it is time-consuming and laborious to wind cables after the winders are used. In view of this problem, there are mainly two types of commercially used winders; one is mechanical winders capable of winding and unwinding the cables by rewind springs, and the other is electric winders capable of winding and unwinding the cables by motors. The electric winders are widely used since they are more labor-saving than the mechanical winders. However, without a switch and a remote intelligent control unit, the existing electric winders fail to realize functions of switch and remote control, which is inconvenient in use, easy to cause fire and other safety problems. The above-mentioned problems should be urgently solved by those skilled in the art.

SUMMARY OF THE INVENTION

In order to overcome the above-mentioned shortcomings in the prior art, the present invention provides an intelligent electric winder and a control method therefor, in which the intelligent electric winder are control to wind or unwind cables through wireless communication, thereby realizing a remote switch function of the intelligent electric winder, and facilitating the use thereof.

The present invention adopts the following technical solutions to achieve the above objectives.

In a first aspect, the present invention provides an intelligent electric winder, comprising:
  a support,
  a winder body, comprising
  a casing fixedly connected to the support,
  a winding reel provided inside the casing,
  a drive structure connected to the winding reel, and
  a cable winded around the winding reel; and
  a control unit, comprising:
  a socket for sending a wireless control signal via a start/stop button; and
  a host for receiving the wireless control signal sent by the socket, and controlling the winding reel to start or stop winding according to the wireless control signal;
wherein the drive structure is electrically connected to the control unit; the host is arranged inside the casing; the socket is arranged outside the casing; the start/stop button is provided on a surface of the socket, and the socket is connected to a free end of the cable.

Preferably, the socket comprises a radio frequency circuit, a Bluetooth circuit or an infrared circuit for transmitting the wireless control signal.

Preferably, the host comprises a main control board and a communication board, wherein the main control board comprises a power module, a Metal Oxide Semiconductor (MCU) drive transistor and a first microprocessor, wherein an input terminal of the power module is electrically connected to an external rectifier module; a 3.3-V output terminal of the power module is electrically connected to the first microprocessor; a 5-V output terminal of the power module is electrically connected to a control electrode of the MOS transistor drive; an input electrode of the MOS transistor drive is electrically connected to the first microprocessor; an output electrode of the MOS transistor drive is electrically connected to the drive structure;

the communication board comprises a first radio frequency module and a second microprocessor, wherein the first radio frequency module is electrically connected to the second microprocessor; the second microprocessor is further electrically connected to the first microprocessor; the first radio frequency module is further electrically connected to the 3.3-V output terminal of the power module.

Preferably, the communication board further comprises a wireless module for receiving a wireless command sent by other equipment and sending out the wireless instruction, so that the first microprocessor controls the winding reel to start or stop winding according to the wireless command; the wireless module is electrically connected to the second microprocessor.

Preferably, the wireless module is a Wireless Fidelity (WIFI) module or a Bluetooth module, and the power module is a voltage transformer/regulator module.

Preferably, the main control board further comprises a sampling resistor; one end of the sampling resistor is electrically connected to the input electrode of the MOS transistor drive, and the other end of the sampling resistor is electrically connected to the first microprocessor.

Preferably, the socket comprises a power module, a second radio frequency module, a single chip microcomputer and a switch module; the power module comprises a voltage regulator chip and a rectifier filter; one end of the second radio frequency module is electrically connected to a 3.3-V output terminal of the voltage regulator chip, and the other end of the second radio frequency module is electrically connected to the single chip microcomputer; a 5-V input terminal of the voltage regulator chip is electrically connected to the rectifier filter; and the single chip microcomputer is electrically connected to the switch module;

the switch module comprises a relay structure and a button structure, wherein the relay structure comprises a start/stop relay; the button structure comprises the start/stop button; one end of the start/stop relay is electrically connected to the single chip microcomputer, and the other end of the start/stop relay is electrically connected to the start/stop button.

Preferably, the relay structure further comprises a live wire relay, a neutral wire relay and an earth wire relay, and the button structure further comprises a live wire button, a neutral wire button and an earth wire button; one end of the live wire relay is electrically connected to the single chip microcomputer, and the other end of the live wire relay is electrically connected to the live wire button; one end of the neutral wire relay is electrically connected to the single chip microcomputer, and the other end of the neutral wire relay is electrically connected to the neutral wire button; one end of the earth wire relay is electrically connected to the single chip microcomputer, and the other end of the earth wire relay is electrically connected to the earth wire button.

Preferably, the single chip microcomputer is an ATmega32L microcontroller; the second radio frequency module is an SI4432 module, and the SI4432 module is electrically connected to the ATmega32L microcontroller via a Serial Peripheral Interface (SPI) serial port.

Preferably, a hidden handle is provided on a top of the support; a screw hole is provided on a bottom of the support, and the bottom of the support has a horizontal surface.

Preferably, a stop block is fixed on a surface of the cable; when the stop block abuts the casing, the winding reel stops winding.

In a second aspect, the present invention provides a control method for the intelligent electric winder, comprising:

when the socket detects a trigger signal from the start/stop button, converting the trigger signal into a wireless control signal and sending the wireless control signal to the host; and when the host receives the wireless control signal sent by the socket, controlling the winding reel to start or stop winding according to the wireless control signal.

Preferably, the control method further comprises: when the host receives a wireless command from other equipment, controlling the winding reel to start or stop winding according to the wireless command.

Preferably, the control method further comprises: the host starts a timing function; when a calculated cumulative time is greater than or equal to a preset time, the host switches an on or off of a power input voltage so that the winding reel is controlled to start or stop winding by the host.

Preferably, the host comprises the main control board and the communication board, wherein the drive structure is a motor, and an automatic detection of the main control board comprises:

carrying out a power-on initialization to obtain a test signal, and determining whether the power input voltage is within a preset range according to the test signal; if yes, starting the motor and controlling the motor to be in a constant speed state; otherwise, cutting off the power input voltage of the main control board;

when the motor is in a constant speed state, determining whether a current of the motor is greater than or equal to a preset current threshold;

if yes, cutting off the power input voltage of the main control board; otherwise, detecting whether a shutdown signal sent by the start/stop button is received; if yes, cutting off the power input voltage of the main control board.

Preferably, the host comprises the main control board and the communication board, and an upgrading of software of the communication board comprises:

carrying out the power-on initialization and confirming the wireless network connection of the software; determining whether a current version of the software is the latest version through the wireless network; if not, upgrading the current version to the latest version through the wireless network.

Preferably, the host comprises the main control board and the communication board, wherein the communication of the communication board comprises:

carrying out the power-on initialization and confirming the wireless network connection of the software;

determining whether the wireless control signal is received; if yes, sending out the wireless control signal, so that the main control board controls the winding reel to start and stop winding according to the wireless control signal; or determining whether a wireless command sent by other equipment is received; if yes, sending out the wireless command so that the main control board controls the winding reel to start and stop winding according to the wireless command.

Preferably, the socket further comprises the live wire relay, the neutral wire relay and the earth wire relay, and the control method for the intelligent electric winder further comprises:

converting an on or off signal received through the wireless network into the wireless control signal, and sending the wireless control signal to the socket, so that the socket respectively controls on-off states of the live wire relay, the neutral wire relay and the earth wire relay according to the on-off signal.

Compared to the prior art, the invention has the following beneficial effects.

The intelligent electric winder of the present invention comprises a support, a winder body and a control unit, wherein the winder body comprises a casing, a winding reel provided inside the casing, a drive structure connected to the winding reel, and a cable winds round the winding reel; the casing is fixedly connected the support; the drive structure is electrically connected to the control unit, and the control unit comprises: a socket for sending a wireless control signal through a start/stop button; and a host, for receiving the wireless control signal sent by the socket and controlling the winding reel to start or stop winding according to the wireless control signal; the drive structure is electrically connected to the control unit; the host is arranged inside the casing; the socket is arranged outside the casing; the start/stop button is provided on a surface of the socket, and the socket is connected to a free end of the cable. The present invention further provides a control method for the intelligent electric winder, in which the winding reel is controlled to start or stop winding by sending a wireless control signal, thereby realizing a remote switch function of the intelligent electric winder, and facilitating the use thereof.

BRIEF DESCRIPTION OF THE DRAWINGS

As a part of the description, the accompanying drawings are intended to facilitate the understanding of the present invention. The accompanying drawings are intended to illustrate the present invention with reference to the embodiments and are not intended to limit the scope of the present invention.

In the drawings.

1, support; 2, winder body; 3, casing; 4, socket; 5, start/stop button; 6, cable; 7, stop block.

DETAILED DESCRIPTION OF EMBODIMENTS

Technical solutions in embodiments of the present invention will be described clearly and completely in conjunction with the accompanying drawings. Obviously, the described embodiments are only a part of the embodiments of the present invention. Based on the embodiments of the present invention, all other embodiments obtained by those skilled in the art without making creative efforts fall within the protection scope of the present invention.

Figure 1:
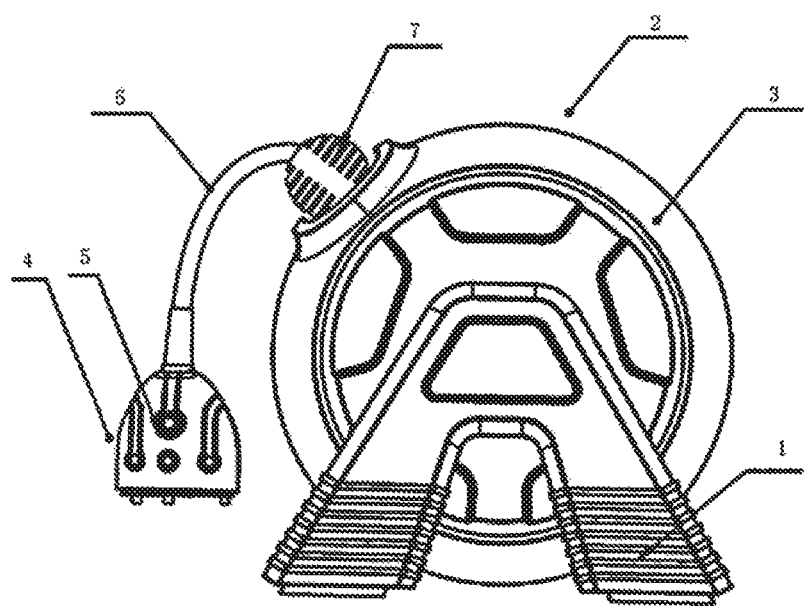
FIG. 1 shows a schematic diagram of an intelligent electric winder according to an embodiment of the present invention.

FIG. 1 is a schematic diagram of an intelligent electric winder according to the embodiment of the present invention. As an example, this embodiment provides an intelligent electric winder, including a support 1 and a winder body 2, where the winder body 2 includes a casing 3, a winding reel provided inside the casing 3, a drive structure connected to the winding reel, and a cable 6 winding on the winding reel; the casing 3 is fixedly connected to the support 1; the intelligent electric winder further includes a control unit, where the drive structure is electrically connected to the control unit, and the control unit includes:

a socket 4 for sending a wireless control signal via a start/stop button 5; and a host for receiving the wireless control signal sent by the socket 4, and controlling the winding reel to start or stop winding according to the wireless control signal;

where the host is arranged inside the casing 3; the socket is arranged outside the casing 3; the start/stop button 5 is provided on a surface of the socket 4, and the socket 4 is connected to a free end of the cable 6.

In some embodiments, the socket 4 includes a radio frequency circuit, a Bluetooth circuit, or an infrared circuit for sending the wireless control signal.

The wireless control signal is a radio frequency signal, a Bluetooth signal or an infrared signal. The wireless control signal is emitted by triggering the start/stop button 5 and then sent to the host via the socket 4.

Specifically, the socket 4 far away from the winder body is provided with a start/stop button 5 to control the winder body 2 to retract the cable 6, thereby greatly facilitating the use convenience of the intelligent electric winder.

The winding of winding reel is started or stopped through the wireless control signal, so that the remote control for starting and stopping winding of the intelligent electric winder is realized through wireless communication, thereby facilitating the use convenience.

Figure 2:
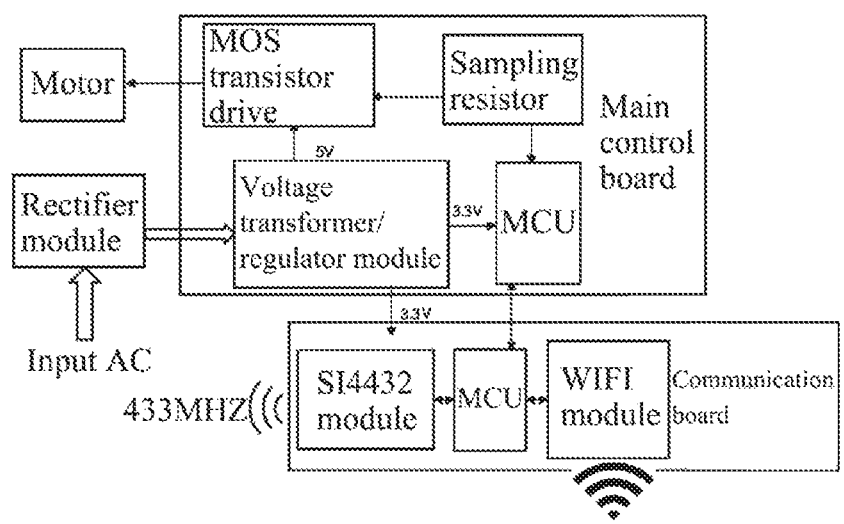
FIG. 2 shows a block diagram of a circuit structure of a main control board according to an embodiment the present invention.
Figure 3:
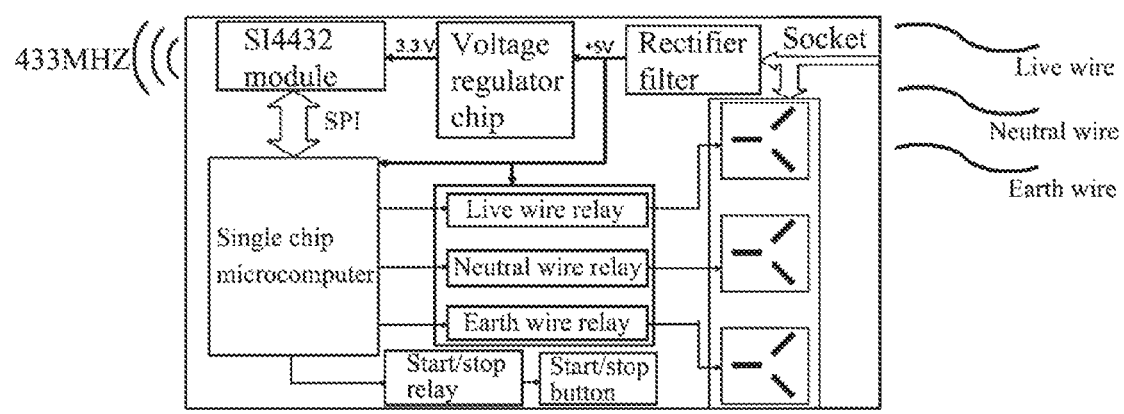
FIG. 3 shows a block diagram of a circuit structure of a communication board according to an embodiment of the present invention.

FIG. 2 is a block diagram of a circuit structure of a main control board according to the embodiment the present invention; and FIG. 3 is a block diagram of a circuit structure of a communication board according to the embodiment of the present invention.

In some embodiments, the host includes a main control board and a communication board.

The main control board includes a power module, a MOS transistor drive and a first microprocessor, where an input terminal of the power module is electrically connected to an external rectifier module; a 3.3-V output terminal of the power module is electrically connected to the first microprocessor; a 5-V output terminal of the power module is electrically connected to a control electrode of the MOS transistor drive; an input electrode of the MOS transistor drive is electrically connected to the first microprocessor, and an output electrode of the MOS transistor drive is electrically connected to the drive structure.

The communication board includes a first radio frequency module and a second microprocessor, where the first radio frequency module is electrically connected to the second microprocessor; the second microprocessor is further electrically connected to the first microprocessor; the first radio frequency module is further electrically connected to the 3.3-V output of the power module.

Specifically, the host includes the main control board and the communication board, and the drive structure in this embodiment is a motor.

The main control board includes the following components:

(1) power supply module: used to provide 5-V power input voltage to the main control board and the socket 4; the power supply module is a voltage transformer/regulator module;

(2) MOS transistor drive: used to drive the motor and adjust the speed thereof;

(3) sampling resistor: used for overcurrent protection for the motor; and (4) first microprocessor: used to control the motor rotation and protect the motor; the first microprocessor is a Microcontroller Unit (MCU).

The communication board includes the following components:

(1) first radio frequency module, used for radio frequency communication with the socket 4, where the radio frequency communication includes the reception and transmission of uplink and downlink data signals, and the first radio frequency module is a wireless 433M RF module, and more particularly is an SI4432 module;

(2) wireless module, used to communicate with a mobile phone application program (APP) or a third-party voice equipment through wireless network connection, where the communication includes the reception and transmission of uplink and downlink data signals. Specifically, the wireless module may be one or a combination of a WIFI module and a Bluetooth module; the third-party voice equipment may be Tmall Genie, Xiaomi Xiaoai, Amazon alexa, Google home assistant, etc.; and (3) second microprocessor, used to process data communication between Radio Frequency (RF) and wireless network (e.g., WIFI network); the second microprocessor is an MCU.

In some embodiments, the communication board further comprises a wireless module for receiving a wireless command sent by other equipment and sending out the wireless command, so that the first microprocessor controls the winding reel to start or stop winding according to the wireless command; the wireless module is electrically connected to the second microprocessor.

Specifically, the other equipment is a wireless intelligent terminal device other than the intelligent electric winder, such as a mobile phone or third-party voice equipment.

Specifically, the intelligent electric winder of this embodiment is an intelligent electric winder that can be remotely controlled by WIFI and the third-party voice equipment, and WIFI networking technologies are applied to the electric winders, thereby greatly facilitating the use and remote control of users.

In some embodiments, the wireless module is a WIFI module or a Bluetooth module, and the power module is a voltage transformer/regulator module.

Specifically, the wireless command is a WIFI command or a Bluetooth command, which is sent by the mobile phone APP or the third-party voice equipment. After being received by the WIFI module or the Bluetooth module, the wireless command is sent to the second microprocessor.

In some embodiments, the main control board further includes a sampling resistor; one end of the sampling resistor is electrically connected to the input electrode of the MOS transistor drive, and the other end of the sampling resistor is electrically connected to the first microprocessor.

Specifically, the intelligent electric winder of the embodiment sends a signal to the communication board according to an action signal of the start/stop button 5 of the socket 4; when the SI4432 module of the communication board receives the corresponding signal and sends it to the MCU, the MCU controls the winder body 2 to start or stop according to the signal.

In some embodiments, the socket 4 includes a power module, a second radio frequency module, a single chip microcomputer and a switch module, where the power module includes a voltage regulator chip and a rectifier filter; one end of the second radio frequency module is electrically connected to a 3.3-V output terminal of the voltage regulator chip, and the other end of the second radio frequency module is electrically connected to the single chip microcomputer; a 5-V input terminal of the voltage regulator chip is electrically connected to the rectification filter; the single chip microcomputer is further electrically connected to the switch module;

the switch module includes a relay structure and a button structure, where the relay structure includes a start/stop relay, and the button structure includes the start/stop button 5; one end of the start/stop relay is electrically connected to the single chip microcomputer, and the other end of the start/stop relay is electrically connected to the start/stop button 5.

Specifically, a control part of the socket 4 mainly includes an SI4432 module (a radio frequency module SI4432) and a single chip microcomputer (an avr single chip microcomputer). The SI4432 module is mainly used to send and receive wireless control signals; the avr single chip microcomputer is mainly used to control a three-way AC power supply; signals of the SI4432 module is communicated with that of the single chip microcomputer via the SPI serial port.

The socket 4 includes the following components:

(1) power module, mainly used to generate the power required by the socket 4. A 120 V/220 V AC power supply is first stepped down and rectified into 5-V DC, and then converted into +3.3-V for use of all parts;

(2) second radio frequency module: the second radio frequency module is a radio frequency transceiver module, and more particularly is an SI4432 module. The second radio frequency module is mainly configured to receive the wireless command sent from the main control board, transmit the received wireless control signal to the single chip microcomputer through the SPI serial port, and send the wireless control signal to the main control board, so that the main control board controls the winding reel to start or stop winding according to the wireless control signal; and (3) single chip microcomputer: the single chip microcomputer is also called a main control single chip microcomputer module, and more particularly is an ATmega32L microcontroller of ATMEL corporation. The single chip microcomputer is mainly configured to send corresponding commands to the corresponding relays according to the information transmitted from the SI4432 module to control the on or off of the three power supplies.

In some embodiments, the relay structure further includes a live wire relay, a neutral wire relay, and an earth wire relay, and the button structure further includes a live wire button, a neutral wire button, and an earth wire button; one end of the live wire relay is electrically connected to the single chip microcomputer, and the other end of the live wire relay is electrically connected to the live wire button; one end of the neutral wire relay is electrically connected to the single chip microcomputer, and the other end of the neutral wire relay is electrically connected to the neutral wire button; one end of the earth wire relay is electrically connected to the single chip microcomputer, and the other end of the earth wire relay is electrically connected to the earth wire button.

Specifically, in the intelligent electric winder of the embodiment, the socket 4 receives the signal from the main control board and sends the signal to the ATmega32L microcontroller, and the ATmega32L microcontroller controls on or off of the three relays (the live wire relay, the neutral wire relay and the earth wire relay) according to the signal, to further control on or off of an output AC power.

In some embodiments, the single chip microcomputer is an ATmega32L microcontroller; the second radio frequency module is an SI4432 module, and the SI4432 module is electrically connected to the ATmega32L microcontroller through the SPI serial port.

Specifically, the SPI is a high-speed, full-duplex, synchronous communication bus; it only occupies four wires on the pins of the chip, thereby saving pins of the chip, saving place and providing convenience for arranging a Printed Circuit Board (PCB).

In some embodiments, a hidden handle is provided on a top of the support 1; a screw hole is provided on a bottom of the support 1, and the bottom of the support 1 has a horizontal surface.

Specifically, the intelligent electric winder of this embodiment adopts a portable design, which can be fixed on a wall or ceiling via screw holes of the base, or placed on the ground through the horizontal bottom surface; it is convenient to move the winder body due to the arrangement of the hidden handle. The intelligent electric winder of this embodiment adopts a structure in which a support 1 is combined with a winding reel and a casing 3; the support 1 is provided with a hidden handle to facilitate lifting and moving of the winder body, and a shape of the winder body 2 is similar to a sphere in which two parts are cut off.

In some embodiments, a stop block 7 is fixed on a surface of the cable 6; when the stop block 7 abuts the casing 3, the winding reel stops winding.

Specifically, the special situation in which the control unit fails to work is dealt by arranging the stop block 7, which provides an additional safety protection for the intelligent electric winder.

Compared to the prior art, the intelligent electric winder of this embodiment has a portable design and can realize remote and intelligent control through either the wireless communication, or the mobile APP or the third-party voice equipment capable for sending a third-party voice, so that the intelligent electric winder is controlled to start or stop winding.

Based on the abovementioned intelligent electric winder, in this embodiment, a control method for the intelligent electric winder is illustrated.

Figure 4:
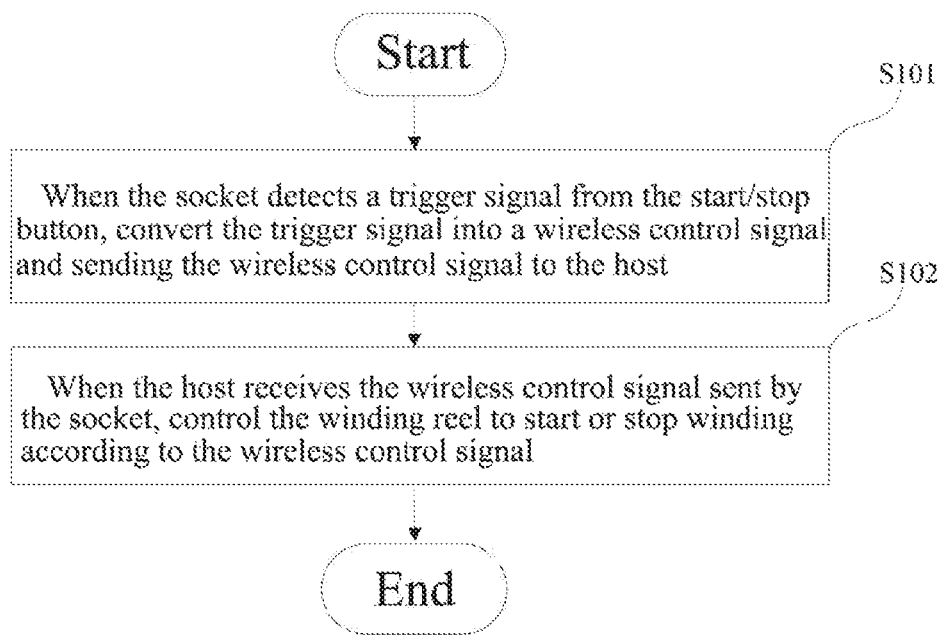
FIG. 4 shows a flow chart of a control method of the intelligent electric winder according to the present invention.

FIG. 4 is a flow chart of a control method for the intelligent electric winder according to the present invention.

As an example, the control method for the intelligent electric winder in this embodiment is based on the abovementioned intelligent electric winder, and includes the following steps:

S101: when the socket 4 detects that the start/stop button 5 issues a trigger signal, the trigger signal is converted into a wireless control signal and sent to the host; and S102: when the host receives the wireless control signal sent by the socket 4, the winding reel is controlled to start or stop winding according to the wireless control signal.

In the control method for the intelligent electric winder of this embodiment, the winding of the winding reel is started or stopped through the wireless control signal, thereby realizing a remote switch function of the intelligent electric winder, and facilitating the use thereof.

In some embodiments, the control method of the intelligent electric winder further includes a step that when the host receives a wireless command sent by other equipment, the winding reel is controlled to start or stop winding according to the wireless command.

In some embodiments, the control method for the intelligent electric winder further includes the following steps: the host starts a timing function; when a calculated cumulative time is greater than or equal to a preset time, the host switches the on or off of the power input voltage, so that the winding reel is switched to start or stop winding by the host.

Specifically, the control method for the intelligent electric winder of the embodiment can not only remotely control the winder body 2 to automatically retract the cable 6 through the socket 4, the mobile phone APP, or the third-party voice equipment, but also simultaneously control a plurality of sockets 4 (that is, the mobile phone APP or the third-party voice equipment can simultaneously wirelessly connect a plurality of intelligent electric winders and perform remote control) to switch on or off of the power and set the time duration of the on and off state of the power respectively. Specifically, the socket 4 receives the signal sent from the main control board, and controls the on and off state of the three relays according to the signal, so as to further control the on and off state of the output AC power.

Figure 5:
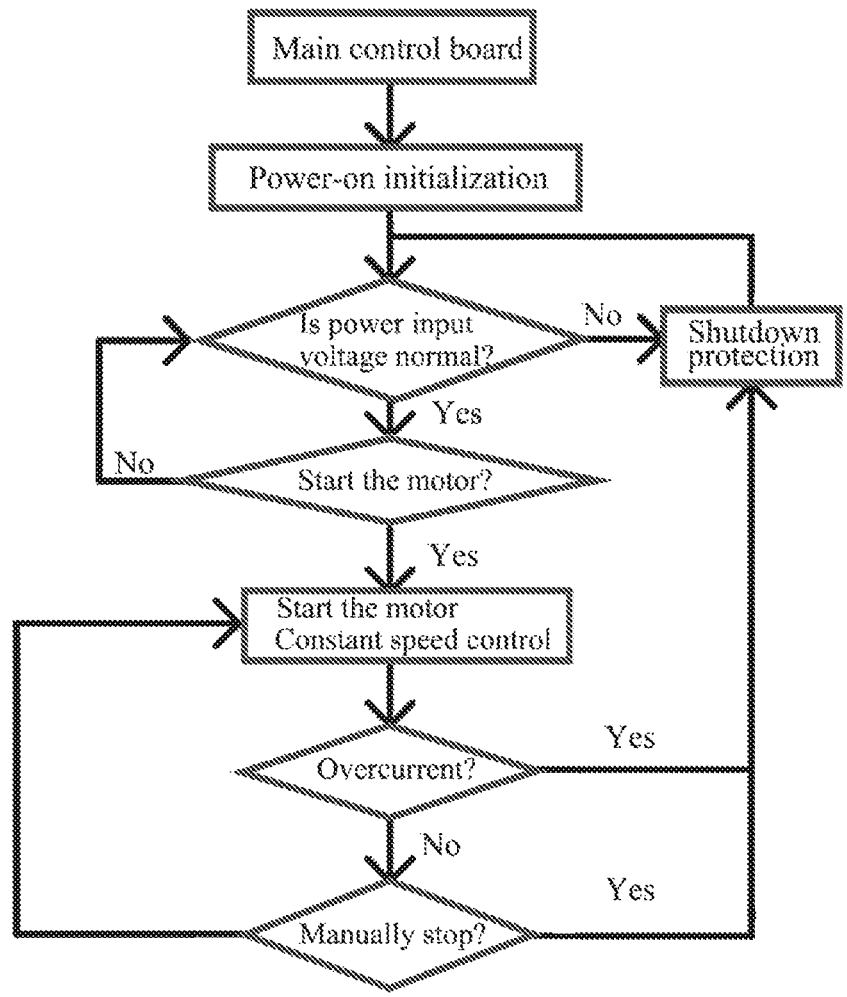
FIG. 5 shows a software flowchart of the main control board according to an embodiment of the present invention.

FIG. 5 is a software flowchart according to an embodiment of the main control board of the present invention.

In some embodiments, the host includes the main control board and the communication board; the drive structure is a motor, and an automatic detection of the main control board includes the following steps.

A power-on initialization is carried out to obtain test signals, and whether the power input voltage is within a preset range is determined according to the test signal; if yes, the motor is started and controlled to be in a constant speed state; otherwise, the power input voltage of the main control board is cut off;

when the motor is in a constant speed state, whether a current of the motor is greater than or equal to a preset current threshold is determined;

if yes, the power input voltage of the main control board is cut off;

otherwise, whether a shutdown signal sent by the start/stop button is received is detected; if yes, the power input voltage of the main control board is cut off.

Specifically, the automatic detection of the main control board can maintain the main control board in a stable working state for a long time; besides, when an abnormal situation is found, the main control board is turned off immediately, so as to protect the intelligence electric winder, thereby greatly extending a service life of the intelligent electric winder.

Figure 6:
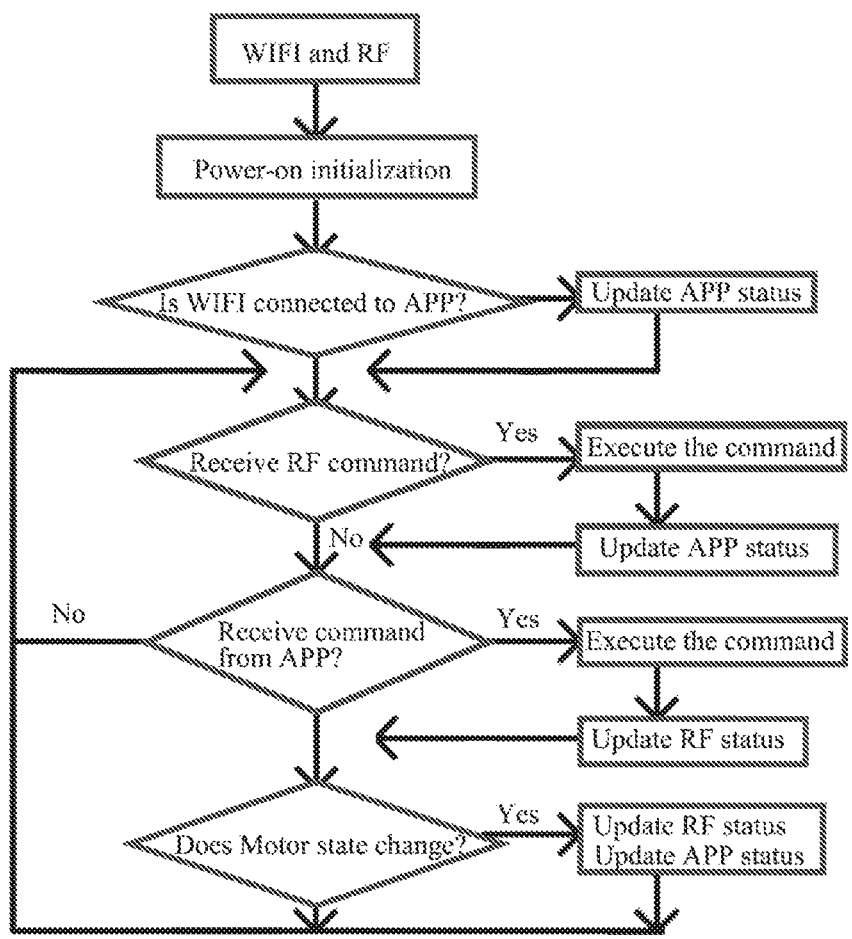
FIG. 6 shows a software flowchart of the communication board according to an embodiment of the present invention.

FIG. 6 is a software flowchart of the communication board according to the embodiment of the present invention In some embodiments, the host includes the main control board and the communication board; steps of upgrading the software of the communication board are described as follows.

The power-on initialization is carried out, and the wireless network connection of the software is confirmed; whether the current version of the software is the latest version is detected through the wireless network; if not, the software is controlled to upgrade the current version to the latest version through the wireless network.

Specifically, the upgrading of the software of the communication board can detect whether the software of the communication board is the latest version in real time, and update it in time if the current version is not the latest version, so as to further improve the functions of the communication board, and performs all-round remote control for the intelligent electric winder.

In some embodiments, the host includes the main control board and the communication board, and the communication of the communication board includes the following steps.

The power-on initialization is carried out and the wireless network connection of the software is confirmed;

whether the wireless control signal is received is determined; if yes, the wireless control signal is sent, so that the main control board controls the winding reel to start or stop winding according to the wireless control signal; or whether a wireless command sent by the other equipment is received is determined; if yes, the wireless command is sent so that the main control board controls the winding reel to start or stop winding according to the wireless command.

In some embodiments, the socket 4 further includes the live wire relay, the neutral wire relay and the earth wire relay, and the control method for the intelligent electric winder further includes the following steps.

An on or off signal received through the wireless network is converted into the wireless control signal, and sent to the socket 4 by the host, so that the socket 4 respectively controls on or off state of the live wire relay, the neutral wire relay and the earth wire relay according to the on or off signal.

Specifically, in the control method for the intelligent electric winder of this embodiment, the socket 4 receives the signal sent from the main control board and sends the signal to the ATmega32L microcontroller; the ATmega32L microcontroller controls the on or off state of 3 relays (the live wire relay, the neutral wire relay and the earth wire relay) according to the signal, so as to further control the on or off of the output AC power.

It should be noted that terms used herein only are only illustrative, but not to limit the scope of the present invention. Unless specified, a singular form also includes a plural form. In addition, it should also be understood that when the terms "comprise" and/or "include" are used in the description, one or combinations of features, steps, operations, devices, components are contained.

Unless specified, the relative arrangement of components and steps, numerical expressions, and numerical values set forth in these embodiments do not limit the scope of the present application. At the same time, it should be understood that, for ease of description, dimensions of various parts shown in the drawings are not drawn according to an actual proportional relationship. Techniques, methods and equipment known to those skilled in the art may not be discussed in detail herein, but the techniques, methods and equipment should be considered as part of the description if necessary. In all examples shown herein, any specific values should be interpreted as merely exemplary and not limiting.

Therefore, other embodiments may have different values. It should be noted that similar reference numerals and letters indicate similar items in the following drawings, and therefore, once an item is defined in a drawing, there is no need to discuss it further in subsequent drawings.

In the description of the invention, it should be understood that orientational terms such as "front", "back", "up", "down", "left", "right", "horizontal", "vertical" and "top", "bottom", are usually based on the orientational or positional relationship shown in the drawings, and only intended to simplify the description of the invention. Unless specified, these orientational terms do not indicate and imply that devices or elements must have a specific orientation or be constructed and operated in a specific orientation, and therefore these orientational terms cannot be construed as limiting the scope of protection of the invention; the orientational terms "inside" and "outside" is relative to the contour of each component.

For ease of description, spatial relative terms can be used herein, such as "above", "on", "upper", etc., are used to describe the spatial relationship between a device and other devices or between a feature and other features shown in the drawings. It should be understood that spatial relative terms are intended to encompass different orientations in use or operation in addition to the orientation of the device shown in the drawings. For example, if a device in the drawing is turned upside down, the device described as "above other equipment or configuration" or "on other equipment or configuration" will then be positioned as "below other equipment or configuration" or "under other equipment or structures". Therefore, the exemplary spatial relative term "above" may include orientations of both "above" and "below". The device can also be positioned in other different ways (being rotated 90 degrees or at other orientations), and the relative description of the space used herein should be explained accordingly.

In addition, it should be noted that, when terms of "first", "second", etc., are used to define parts, it is only intended to distinguish the corresponding parts, but not to limit the protection scope of the invention.

Although some embodiments of the present invention have been illustrated above, various changes, modifications, substitutions and variations to these embodiments can be made by those skilled in the art without departing from the principle and spirit of the present invention. The scope of the present invention is defined solely by the appended claims or equivalents thereof.

What is claimed is:

1. An intelligent electric winder, comprising:
   a support;
   a winder body, comprising:
      a casing fixedly connected to the support,
      a winding reel provided inside the casing,
      a drive structure connected to the winding reel, and
      a cable winded around the winding reel; and
   a control unit, comprising:
      a socket for sending a wireless control signal via a start/stop button; and
      a host for receiving the wireless control signal sent by the socket and controlling the winding reel to start or stop winding according to the wireless control signal;
   wherein the drive structure is electrically connected to the control unit; the host is arranged inside the casing; the socket is arranged outside the casing; the start/stop button is provided on a surface of the socket, and the socket is connected to a free end of the cable;
   the host comprises a main control board and a communication board;
   wherein the main control board comprises a power module, an MOS transistor drive and a first microprocessor, wherein an input terminal of the power module is electrically connected to an external rectifier module; a 3.3-V output terminal of the power module is electrically connected to the first microprocessor; a 5-V output terminal of the power module is electrically connected to a control electrode of the MOS transistor drive; an input electrode of the MOS transistor drive is electrically connected to the first microprocessor; and an output electrode of the MOS transistor drive is electrically connected to the drive structure; and
   the communication board comprises a first radio frequency module and a second microprocessor, wherein the first radio frequency module is electrically connected to the second microprocessor; the second microprocessor is further electrically connected to the first microprocessor; the first radio frequency module is further electrically connected to the 3.3-V output terminal of the power module.

2. The intelligent electric winder of claim 1, wherein the communication board further comprises a wireless module for receiving a wireless command sent by other equipment and sending out the wireless command, so that the first microprocessor controls the winding reel to start or stop winding according to the wireless command; and the wireless module is electrically connected to the second microprocessor.

3. The intelligent electric winder of claim 2, wherein the wireless module is a WIFI module or a Bluetooth module, and the power module is a voltage transformer/regulator module.

4. An intelligent electric winder, comprising:
   a support;
   a winder body, comprising:
   a casing fixedly connected to the support,
   a winding reel provided inside the casing,
   a drive structure connected to the winding reel, and
   a cable winded around the winding reel; and
   a control unit, comprising:
   a socket for sending a wireless control signal via a start/stop button; and
   a host for receiving the wireless control signal sent by the socket and controlling the winding reel to start or stop winding according to the wireless control signal;
   wherein the drive structure is electrically connected to the control unit; the host is arranged inside the casing; the socket is arranged outside the casing; the start/stop button is provided on a surface of the socket, and the socket is connected to a free end of the cable;
   the socket comprises a power module, a radio frequency module, a single chip microcomputer and a switch module; the power module comprises a voltage regulator chip and a rectifier filter; one end of the radio frequency module is electrically connected to a 3.3-V output terminal of the voltage regulator chip, and the other end of the radio frequency module is electrically connected to the single chip microcomputer; a 5-V input terminal of the voltage regulator chip is electrically connected to the rectifier filter; the single chip microcomputer is electrically connected to the switch module; and
   the switch module comprises a relay structure and a button structure, wherein the relay structure comprises a start/stop relay; the button structure comprises the start/stop button; one end of the start/stop relay is electrically connected to the single chip microcomputer, and the other end of the start/stop relay is electrically connected to the start/stop button.

5. The intelligent electric winder of claim 4, wherein the relay structure further comprises a live wire relay, a neutral wire relay and an earth wire relay, and the button structure further comprises a live wire button, a neutral wire button and an earth wire button; one end of the live wire relay is electrically connected to the single chip microcomputer, and the other end of the live wire relay is electrically connected to the live wire button; one end of the neutral wire relay is electrically connected to the single chip microcomputer, and the other end of the neutral wire relay is electrically connected to the neutral wire button; one end of the earth wire relay is electrically connected to the single chip microcomputer, and the other end of the earth wire relay is electrically connected to the earth wire button.

6. The intelligent electric winder of claim 4, wherein the single chip microcomputer is an ATmega32L microcontroller; the radio frequency module is an SI4432 module, and the SI4432 module is electrically connected to the ATmega32L microcontroller via an SPI serial port.

\* \* \* \* \*